(12) United States Patent
Chen

(10) Patent No.: US 12,274,143 B2
(45) Date of Patent: Apr. 8, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Tao Chen, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 472 days.

(21) Appl. No.: 17/274,642

(22) PCT Filed: Dec. 14, 2020

(86) PCT No.: PCT/CN2020/136006
§ 371 (c)(1),
(2) Date: Mar. 9, 2021

(87) PCT Pub. No.: WO2022/099844
PCT Pub. Date: May 19, 2022

(65) Prior Publication Data
US 2022/0310705 A1    Sep. 29, 2022

(30) Foreign Application Priority Data

Nov. 11, 2020 (CN) .......................... 202011251766.9

(51) Int. Cl.
*H10K 59/35* (2023.01)
*H10K 59/60* (2023.01)
*H10K 59/65* (2023.01)

(52) U.S. Cl.
CPC .......... *H10K 59/353* (2023.02); *H10K 59/60* (2023.02); *H10K 59/65* (2023.02)

(58) Field of Classification Search
CPC ......... H10K 59/351–353; H10K 59/60; H10K 59/65
See application file for complete search history.

(56) References Cited

U.S. PATENT DOCUMENTS

2016/0276615 A1* 9/2016 Kitabayashi ......... H10K 50/852
2018/0033842 A1* 2/2018 Bae ........................ H10K 71/12
(Continued)

FOREIGN PATENT DOCUMENTS

| CN | 107665905 A | 2/2018 |
|----|-------------|--------|
| CN | 108735790 A | 11/2018 |

(Continued)

*Primary Examiner* — Eric K Ashbahian
(74) *Attorney, Agent, or Firm* — The Roy Gross Law Firm, LLC; Roy D. Gross

(57) ABSTRACT

A display panel and a display device are provided. A size of a first pixel opening is greater than a size of a second pixel opening. A ratio of an orthographic projection area of a first light-emitting layer projected on a substrate to an orthographic projection area of a second light-emitting layer projected on the substrate ranges from 95% to 105%. Reducing a size of the second pixel opening of a display light transmission region without reducing a PPI of the display light transmission region is beneficial to improve a display effect of the display light transmission region. There is no need to modify a mask sheet mesh, and no need to specially design a mask for the display light transmission region.

7 Claims, 7 Drawing Sheets

(56) References Cited

U.S. PATENT DOCUMENTS

2020/0105843 A1* 4/2020 Baek .................... H10K 50/813
2022/0085116 A1* 3/2022 Qin ...................... H10K 50/818
2022/0376015 A1* 11/2022 Cheng ................ H10K 59/1216

FOREIGN PATENT DOCUMENTS

| CN | 108807489 A | 11/2018 |
| CN | 112072000 A | 12/2020 |

\* cited by examiner

DISPLAY PANEL AND DISPLAY DEVICE

This application is a National Phase of PCT Patent Application No. PCT/CN2020/136006 having International filing date of Dec. 14, 2020, which claims the benefit of priority of Chinese Patent Application No. 202011251766.9, filed Nov. 11, 2020, the contents of which are all incorporated herein by reference in their entirety.

FIELD OF INVENTION

The present invention relates to the field of display technologies, and in particular, to a display panel and a display device.

BACKGROUND OF INVENTION

Due to an extremely high screen-to-body ratio, full screens bring brand-new visual experiences and sensory impact to people, and have become a goal pursued by display panel manufacturers.

At present, a common design of an under-screen camera is to dig a hole in a camera region of a display panel, and a light transmission region of the camera does not display pictures. A penetration rate of the display panel in this way will be relatively high, but user's display experience is not good, and a full-screen effect cannot be presented. Another way is to set a display light transmission region on the display panel, and set the under-screen camera in the display panel corresponding to a position of the display light transmission region. In order to meet lighting requirements of the under-screen camera, a design of reducing a pixel density (pixel per inch, PPI) is often adopted, that is, the PPI of the display light transmission region is reduced. However, the design will result in a large difference between a display effect of the display light transmission region and a display effect of a main display region, display color is not rich, and the display effect is not good. In addition, due to a difference between a pixel arrangement of the display light transmission region and a pixel arrangement of the main display region, it is necessary to modify a design of a mask corresponding to the display light transmission region, or use two masks for evaporation, thereby increasing process costs.

In summary, there is an urgent need to provide a display panel and a display device to solve the above technical problems.

Technical Problem

An embodiment of the present application provides a display panel and a display device to solve a technical problem that current display panels and display devices, in order to meet lighting requirements of under-screen cameras, result in poor display effect in a display light transmission region.

Technical Solution

In order to solve the above problems, technical solutions provided by the present application are as follows.

An embodiment of the present application provides a display panel. The display panel comprises a main display region and at least one display light transmission region; and a substrate and a pixel definition layer disposed on a side of the substrate; wherein the pixel definition layer defines a plurality of first pixel openings in the main display region and a first light-emitting layer is provided on each first pixel opening, and the pixel definition layer defines a plurality of second pixel openings in the display light transmission region and a second light-emitting layer is provided on each second pixel opening; wherein the first light-emitting layer is all disposed in the first pixel opening, an edge of the second light-emitting layer overflows the second pixel opening, and the second light-emitting layer covers the second pixel opening and the pixel definition layer disposed in the display light transmission region; and wherein a size of the first pixel opening is greater than a size of the second pixel opening, a ratio of an orthographic projection area of the first light-emitting layer projected on the substrate to an orthographic projection area of the second light-emitting layer projected on the substrate ranges from 95% to 105%.

According to the display panel provided by the embodiment of the present application, the orthographic projection area of the first light-emitting layer projected on the substrate is equal to the orthographic projection area of the second light-emitting layer projected on the substrate.

According to the display panel provided by the embodiment of the present application, an orthographic projection shape of the first light-emitting layer projected on the substrate is the same as an orthographic projection shape of the second light-emitting layer projected on the substrate.

According to the display panel provided by the embodiment of the present application, the substrate is further provided with a first anode and a second anode, the first anode is located at a bottom of each first pixel opening, and the second anode is located at a bottom of each second pixel opening; and a distance between an edge of the first anode away from the first pixel opening and a bottom edge of the first pixel opening is a first distance, and a distance between an edge of the second anode away from the second pixel opening and a bottom edge of the second pixel opening is a second distance;

wherein the first distance is greater than the second distance.

According to the display panel provided by the embodiment of the present application, the second distance ranges from 1 μm to 3 μm.

According to the display panel provided by the embodiment of the present application, the main display region comprises a plurality of first pixel units, and the display light transmission region comprises a plurality of second pixel units; and wherein within a same unit area, a number of the first pixel units included in the main display region is equal to a number of the second pixel units included in the display light transmission region.

According to the display panel provided by the embodiment of the present application, a distance between two center points of two adjacent first pixel units is equal to a distance between two center points of two adjacent second pixel units, a distance between the center point of the adjacent first pixel unit and the center point of the second pixel unit is equal to the distance between the two center points of two adjacent first pixel units.

An embodiment of the present application provides a display panel. The display panel comprises a main display region and at least one display light transmission region; and a substrate and a pixel definition layer disposed on a side of the substrate; wherein the pixel definition layer defines a plurality of first pixel openings in the main display region and a first light-emitting layer is provided on each first pixel opening, and the pixel definition layer defines a plurality of second pixel openings in the display light transmission region and a second light-emitting layer is provided on each second pixel opening; and wherein a size of the first pixel opening is greater than a size of the second pixel opening, a ratio of an orthographic projection area of the first light-emitting layer projected on the substrate to an orthographic projection area of the second light-emitting layer projected on the substrate ranges from 95% to 105%.

According to the display panel provided by the embodiment of the present application, the orthographic projection area of the first light-emitting layer projected on the substrate is equal to the orthographic projection area of the second light-emitting layer projected on the substrate.

According to the display panel provided by the embodiment of the present application, an orthographic projection shape of the first light-emitting layer projected on the substrate is the same as an orthographic projection shape of the second light-emitting layer projected on the substrate.

According to the display panel provided by the embodiment of the present application, the substrate is further provided with a first anode and a second anode, the first anode is located at a bottom of each first pixel opening, and the second anode is located at a bottom of each second pixel opening; and a distance between an edge of the first anode away from the first pixel opening and a bottom edge of the first pixel opening is a first distance, and a distance between an edge of the second anode away from the second pixel opening and a bottom edge of the second pixel opening is a second distance;

wherein the first distance is greater than the second distance.

According to the display panel provided by the embodiment of the present application, the second distance ranges from 1 μm to 3 μm.

According to the display panel provided by the embodiment of the present application, the main display region comprises a plurality of first pixel units, and the display light transmission region comprises a plurality of second pixel units; and wherein within a same unit area, a number of the first pixel units included in the main display region is equal to a number of the second pixel units included in the display light transmission region.

According to the display panel provided by the embodiment of the present application, a distance between two center points of two adjacent first pixel units is equal to a distance between two center points of two adjacent second pixel units, and a distance between the center point of the adjacent first pixel unit and the center point of the second pixel unit is equal to the distance between the two center points of two adjacent first pixel units.

According to the display panel provided by the embodiment of the present application, the first pixel unit comprises a plurality of first sub-pixels, the second pixel unit comprises a plurality of second sub-pixels, the first sub-pixels are disposed in the pixel definition layer, the first anode, the first light-emitting layer, and the first pixel opening of the main display region, and the second sub-pixels are disposed in the pixel definition layer, the second anode, the second light-emitting layer, and the second pixel opening of the display light transmission region; and wherein a distance between two light-emitting layers of two adjacent first sub-pixels is equal to a distance between two light-emitting layers of two adjacent second sub-pixels.

According to the display panel provided by the embodiment of the present application, a ratio of a sum of areas of the second anodes corresponding to all the second sub-pixels to an area of the display light transmission region is less than or equal to 25%.

According to the display panel provided by the embodiment of the present application, a ratio of a light-emitting pixel area of the second sub-pixel to a light-emitting pixel area of the first sub-pixel having a same color ranges from 0.2 to 0.6, and a ratio of an area of the second anode corresponding to the second sub-pixel to an area of the first anode corresponding to the first sub-pixel having a same color ranges from 0.2 to 0.6.

According to the display panel provided by the embodiment of the present application, a plurality of pixel drive circuit units are further provided on the substrate, the plurality of pixel drive circuit units are for driving the second sub-pixels to emit light, and the pixel drive circuit units are provided outside the display light transmission region; and a plurality of the second sub-pixels having a same color in a same second pixel unit are electrically connected to a same pixel driving circuit unit.

According to the display panel provided by the embodiment of the present application, the second anodes of the plurality of the second sub-pixels having a same color in the same second pixel unit are electrically connected to each other, and are electrically connected to the corresponding pixel drive circuit units.

An embodiment of the present application provides a display device comprising the above-mentioned display panel; and a photosensitive element disposed on a side of the display panel and disposed corresponding to the display light transmission region.

Beneficial Effect

Beneficial effects of the present application are: in a display panel and a display device provided in the present application, a size of a first pixel opening in a main display region is designed to be larger than a size of a second pixel opening in a display light transmission region to meet lighting requirements of an under-screen camera disposed corresponding to the display light transmission region. A ratio of an orthographic projection area of a first light-emitting layer projected on a substrate to an orthographic projection area of a second light-emitting layer projected on the substrate ranges from 95% to 105%, so that in a process of manufacturing the display panel, a mask design used in the display light transmission region can be consistent with a mask design used in the main display region. There is no need to modify a mask sheet mesh, and there is no need to design a special mask for the display light transmission region, which is beneficial to save processes, reduce process costs, and improve production efficiency. In addition, since only the size of the second pixel opening of the display light transmission region is reduced without reducing a PPI of the display light transmission region, it is beneficial to improve a display effect of the display light transmission region.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The present application is directed to a display panel and a display device in the prior art. In order to meet lighting requirements of an under-screen camera, a technical problem of poor display effect in a display light transmission region is caused. The present embodiment can solve the defect.

Figure 1:
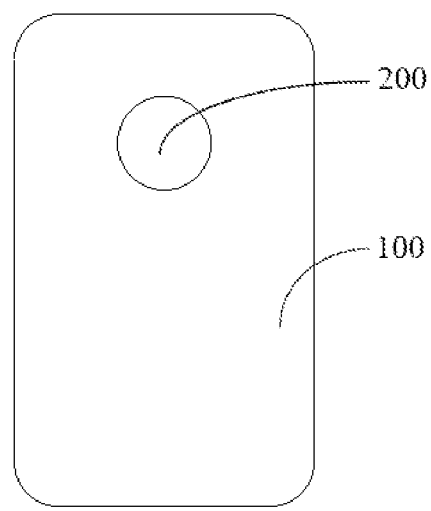
FIG. 1 is a schematic structural view of a plane of a display panel provided by an embodiment of the present application.

Please refer to FIG. 1, a display panel provided by an embodiment of the present application comprises a main display region 100 and at least one display light transmission region 200 (if required, a display transition region can also be disposed between the main display region 100 and the display light transmission region 200, which is not limited in the embodiment). The main display region 100 is a region mainly configured to display images. While the display light transmission region 200 is configured to display images, it can transmit light so that a photosensitive element disposed on one side of the display panel and corresponding to the display light transmission region 200 receives light signals. Wherein, the photosensitive element may be a camera, an optical touch component, a fingerprint recognition sensor, etc., so that the display panel can realize functions such as photographing, optical touch, and optical fingerprint recognition.

A shape of the display light transmission region 200 may be circular, rectangular, rounded rectangular, or irregular polygonal. The display panel may comprise a plurality of the display light transmission regions 200. It should be noted that, in order to facilitate a description of a technical solution of the present embodiment, the embodiment is described by taking the display panel having one display light transmission region 200 as an example.

Figure 2:
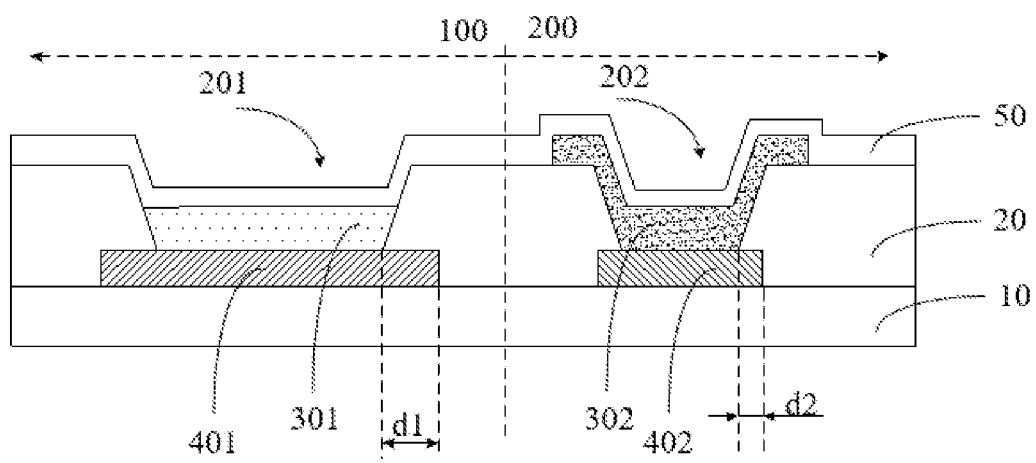
FIG. 2 is a schematic structural view of a cross-section of the display panel provided by the embodiment of the present application.

Please refer to FIG. 2, the display panel comprises a substrate 10 and a pixel definition layer 20 disposed on a side of the substrate 10. The pixel definition layer 20 defines a plurality of first pixel openings 201 in the main display region 100 and a first light-emitting layer 301 is provided on each first pixel opening 201. The pixel definition layer 20 defines a plurality of second pixel openings 202 in the display light transmission region 200 and a second light-emitting layer 302 is provided on each second pixel opening 202. Each first light-emitting layer 301 and each second light-emitting layer 302 comprises at least three types, such as a red light-emitting layer, a green light-emitting layer, and a blue light-emitting layer, to realize a display of multiple colors of the display panel.

The display panel may be an active-matrix organic light emitting diode display panel. It is understandable that usually only reflective electrodes and signal traces of organic light emitting diode devices are made of opaque materials, and most of the other functional films are made of light-transmitting materials. Since the opaque materials are concentrated in the organic light-emitting diode devices and nearby regions, most of non-pixel setting regions are transparent.

In order to meet the lighting requirements of the under-screen camera provided corresponding to the display light transmission region 200 and obtain a better light-sensing effect, a size of the first pixel opening 201 is designed to be larger than a size of the second pixel opening 202. In a same unit area, the display light transmission region 200 has a larger non-pixel arrangement region than the main display region 100. In other words, the display light transmission region 200 has a larger area of the light transmission region relative to the main display region 100, so that a light transmittance of the display light transmission region 200 meets the requirements.

In the embodiment, the first light-emitting layer 301 and the second light-emitting layer 302 are formed by using a mask with a same pattern design, so that a ratio of an orthographic projection area of the first light-emitting layer 301 projected on the substrate 10 to an orthographic projection area of the second light-emitting layer 302 projected on the substrate 10 ranges from 95% to 105%. Specifically, an evaporation of the first light-emitting layer 301 and the second light-emitting layer 302 at the first pixel opening 201 and the second pixel opening 202 may have following multiple situations: First, the first light-emitting layer 301 is all located in the first pixel opening 201, and the second light-emitting layer 302 is all located in the second pixel opening 202. Meanwhile, in a direction perpendicular to a plane of the substrate 10, a height of the first light-emitting layer 301 is less than a height of the second light-emitting layer 302. Second, the first light-emitting layer 301 is all located in the first pixel opening 201, and the second light-emitting layer 302 is partially located in the second pixel opening 202. Meanwhile, an edge of the second light-emitting layer 302 overflows the second pixel opening 202, and the second light-emitting layer 302 covers the second pixel opening 202 and the pixel definition layer 20 located in the display light transmission region 200. Third, an edge of the first light-emitting layer 301 overflows the first pixel opening 201, and the edge of the second light-emitting layer 302 also overflows the second pixel opening 202. Regardless of the above-mentioned multiple cases, the ratio of the orthographic projection area of the first light-emitting layer 301 projected on the substrate 10 to the orthographic projection area of the second light-emitting layer 302 projected on the substrate 10 ranges from 95% to 105%.

Preferably, the orthographic projection area of the first light-emitting layer 301 projected on the substrate 10 is equal to the orthographic projection area of the second light-emitting layer 302 projected on the substrate 10. Further, since the first light-emitting layer 301 and the second light-emitting layer 302 are formed by using the mask with the same pattern design, a shape of an opening of the mask for forming the first light-emitting layer 301 is same as a shape of an opening of the mask for forming the second light-emitting layer 302. Therefore, an orthographic projection shape of the first light-emitting layer 301 projected on the substrate 10 is same as an orthographic projection shape of the second light-emitting layer 302 projected on the substrate 10. It is understandable that during a manufacturing process of the display panel, a design of the mask used in the display light transmission region 200 is consistent with a design of the mask used in the main display region 100, so there is no need to modify a mask sheet mesh, and there is no need to design a special mask for the display light transmission region 200, which is beneficial to reduce process costs and improve production efficiency. In addition, in the present application, only one mask is required to complete the forming of the first light-emitting layer 301 and the second light-emitting layer 302, which is conducive to simplifying the processes and reducing the process costs compared with the prior art of using two masks to form the first light-emitting layer 301 and the second light-emitting layer 302 by vapor deposition separately.

The substrate 10 is further provided with a first anode 401 and a second anode 402. The first anode 401 is disposed at a bottom of the first pixel opening 201, and the second anode 402 is disposed at a bottom of the plurality of second pixel openings 202. The first anode 401 and the second anode 402 are located on a side of the substrate 10 close to the pixel definition layer 20. A distance between an edge of the first anode 401 away from the first pixel opening 201 and a bottom edge of the first pixel opening 201 is a first distance $d_1$. A distance between an edge of the second anode 402 away from the second pixel opening 202 and a bottom edge of the second pixel opening 202 is a second distance $d_2$. In the embodiment of the present application, the first distance $d_1$ is greater than the second distance $d_2$. Based on current process capability, when a size of the second anode 402 located in the display light transmission region 200 is reduced to a specific size, the light transmittance of the display light transmission region 200 can be improved, and the size of the second pixel opening 202 is relatively large, which is beneficial to improve light-emitting life of the organic light-emitting diode. Specifically, the second distance $d_2$ ranges from 1 μm to 3 μm.

Specifically, the first anode 401 and the second anode 402 may comprise a first reflective metal layer, a first transparent conductive layer, and a second reflective metal layer stacked on top of each other. Materials of the first reflective metal layer and the second reflective metal layer comprise metallic silver, and a material of the first transparent conductive layer comprises indium tin oxide.

The display panel further comprises a thin film transistor array layer (not shown in the figure) and a cathode 50. The thin film transistor array layer is disposed on a side of the substrate 10 close to the pixel definition layer 20, and is configured to drive the pixel unit to emit light to realize display. The cathode 50 covers the pixel definition layer 20, the first light-emitting layer 301, and the second light-emitting layer 302, and is configured to form a light-emitting device.

Figure 3:
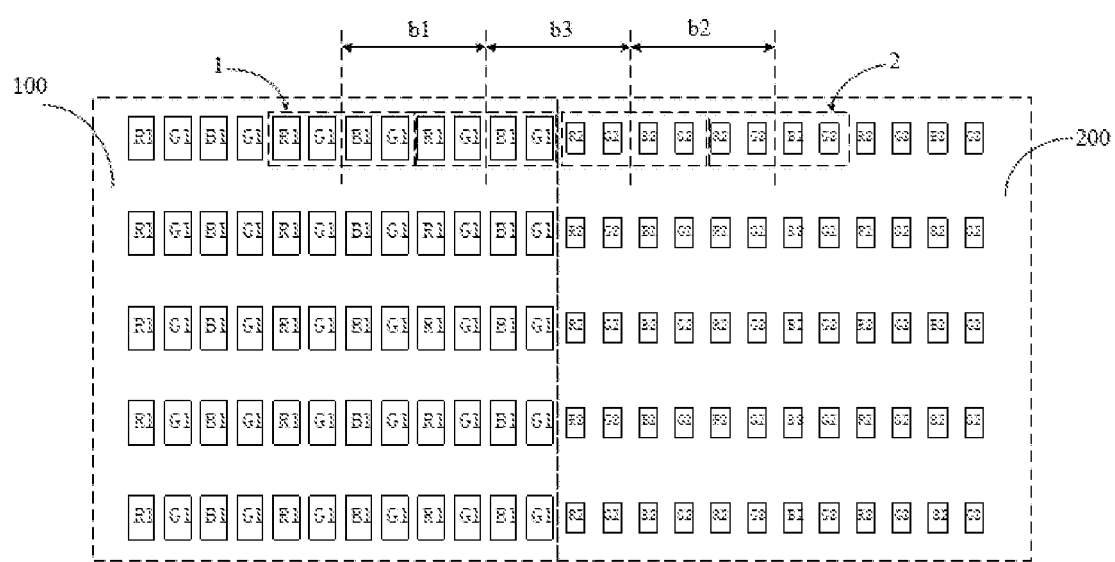
FIG. 3 is a schematic structural view of an arrangement of a first pixel unit provided by the embodiment of the present application.

Please refer to FIG. 3, the main display region 100 comprises a plurality of first pixel units 1, which are configured to realize light-emitting display in the main display region 100. The display light transmission region 200 comprises a plurality of second pixel units 2, which are configured to realize light-emitting display in the display light transmission region 200. Wherein, the main display region 100 and the display light transmission region 200 have same PPI. Specifically, within a same unit area, the number of the first pixel units 1 included in the main display region 100 is equal to the number of the second pixel units 2 included in the display light transmission region 200.

It can be understood that, in the embodiment, the display light transmission region 200 and the main display region 100 have same PPI. Without reducing the PPI of the display light transmission region 200, a light-emitting pixel area of the display light transmission region 200 is reduced to meet the lighting requirements, so that in the same unit area, the number of pixels in the display light transmission region 200 is equal to the number of pixels in the main display region 100. Compared with the prior art solution of increasing a light transmittance by reducing the PPI of the display light transmission region 200, the number of the pixels in the display light transmission region 200 is relatively increased in the same unit area, thus the display picture of the display light transmission region 200 is more delicate, richness of the display picture is increased, and a display effect is improved. In addition, a purpose of an arrangement is that for the mask used for the entire display panel, not only can pixel openings of the display light transmission region 200 and the main display region 100 adopt a same design, but also an arrangement of pixel openings in two regions can adopt a same design. Therefore, there is no need to specially design a mask for the display light transmission region 200, so that the mask used by the current display panel (that is, the display panel without the display light transmission region 200) can be directly applied, thus greatly saving manufacturing costs, reducing process difficulty, and facilitating mass productions of products.

Further, a distance $b_1$ between two center points of two adjacent first pixel units 1 is equal to a distance $b_2$ between two center points of two adjacent second pixel units 2, and a distance $b_2$ between the center point of the first pixel unit 1 and the center point of the second pixel unit 2 adjacent with each other is equal to a distance $b_3$ between the center points of two adjacent first pixel units 1, to ensure that an arrangement structure of pixel units of the display light transmission region 200 is consistent with an arrangement structure of pixel units of the main display region 100, and both have a same period. Therefore, the display effects of the display light transmission region 200 and the main display region 100 remain the same, thereby reducing a display difference between the display light transmission region 200 and the main display region 100, and making an overall display effect of the display panel better.

It should be noted that, in the embodiment, the distance between two adjacent first pixel units 1 can be either a distance between two adjacent first pixel units 1 in a row direction, or a distance between two adjacent first pixel units 1 in a column direction. The distance between two adjacent second pixel units 2 may be a distance between two adjacent second pixel units 2 in a row direction, or a distance between two adjacent second pixel units 2 in a column direction.

Figure 4:
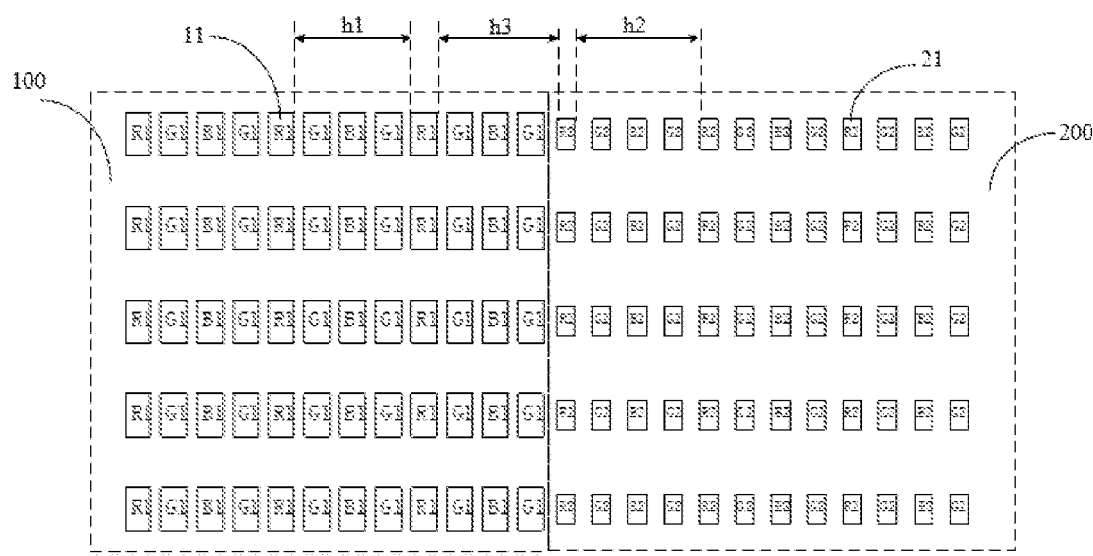
FIG. 4 is a schematic structural view of an arrangement of a second pixel unit provided by the embodiment of the present application.

Further, please refer to FIG. 4, the first pixel unit 1 comprises a plurality of first sub-pixels 11, and the second pixel unit 2 comprises a plurality of second sub-pixels 21. The first sub-pixels 11 are disposed in the pixel definition layer 20, the first anode 401, the first light-emitting layer 301, and the first pixel opening 201 located in of the main display region 100. The second sub-pixels 21 are disposed in the pixel defining layer 20, the second anode 402, the second light-emitting layer 302, and the second pixel opening 202 of the display light transmission region 200. The plurality of first sub-pixels 11 may comprise a first red sub-pixel R1, a first green sub-pixel G1, and a first blue sub-pixel B1. The plurality of second sub-pixels 21 may comprise a second red sub-pixel R2, a second green sub-pixel G2, and a second blue sub-pixel B2. Of course, the plurality of first sub-pixels 11 may further comprise a first white sub-pixel W1 (not shown in the figure), and the plurality of second sub-pixels 21 may further comprise a second white sub-pixel W2 (not shown in the figure), which is not limited.

Within the same unit area, the number of the first sub-pixels 11 included in the main display region 100 is equal to the number of the second sub-pixels 21 included in the display light transmission region 200. Further, a distance between the light-emitting layers of two adjacent first sub-pixels 11 is equal to a light-emitting layer between two adjacent second sub-pixels 21, so as to ensure that an arrangement structure of the first sub-pixels 11 of the display light transmission region 200 is consistent with an arrangement structure of the second sub-pixels 21 of the main display region 100, and both have the same period. Thereby, the display effects of the display light transmission region 200 and the main display region 100 remain the same, and the overall display effect of the display panel is further improved.

Similarly, the distance between the light-emitting layers of two adjacent first sub-pixels 11 may be a distance between the light-emitting layers of two adjacent and spaced apart first sub-pixels 11 in a row direction, or may be a distance between the light-emitting layers of two adjacent and spaced apart first sub-pixels 11 in a column direction. The distance between the light-emitting layers of two adjacent second sub-pixels 21 may be a distance between the light-emitting layers of two adjacent and spaced apart second sub-pixels 21 in a row direction, or may be a distance between the light-emitting layers of two adjacent and spaced apart second sub-pixels 21 in a column direction.

It should be noted that in a case, the distance between the light-emitting layers of any two adjacent sub-pixels having a same color is equal, which is specifically expressed as:

First, a distance h1 between the light-emitting layers of any two adjacent first sub-pixels 11 having a same color is equal. For example, a distance between the light-emitting layers of any two adjacent first red sub-pixels R1 is equal, a distance between the light-emitting layers of any two adjacent first green sub-pixels G1 is equal, and a distance between the light-emitting layers of any two adjacent first blue sub-pixel B1 is equal. Second, a distance h2 between the light-emitting layers of any two adjacent second sub-pixels 21 having a same color is equal. For example, a distance between the light-emitting layers of any two adjacent second red sub-pixels R2 is equal, a distance between the light-emitting layers of any two adjacent second green sub-pixels G2 is equal, and a distance between the light-emitting layers of any two adjacent second blue sub-pixel B2 is equal. Third, a distance h3 between any of a light-emitting layer of the first sub-pixel 11 and a light-emitting layer of the second sub-pixel 21 having a same color adjacent with each other is equal. For example, a distance between the light-emitting layers of any two adjacent first red sub-pixels R1 and the second red sub-pixel R2 is equal, a distance between the light-emitting layers of any two adjacent first green sub-pixels G1 and the second green sub-pixel G2 is equal, and a distance between the light-emitting layers of any two adjacent first blue sub-pixels B1 and the second blue sub-pixel B2 is equal. Fourth, the distance h1 between the light-emitting layers of any two adjacent first sub-pixels 11 having the same color is equal to the distance h2 between the light-emitting layers of any two adjacent second sub-pixels 21 having the same color, and is equal to the distance h3 between the light-emitting layer of the first sub-pixels 11 and the light-emitting layer of the second sub-pixels 21 having the same color adjacent with each other.

Figure 5:
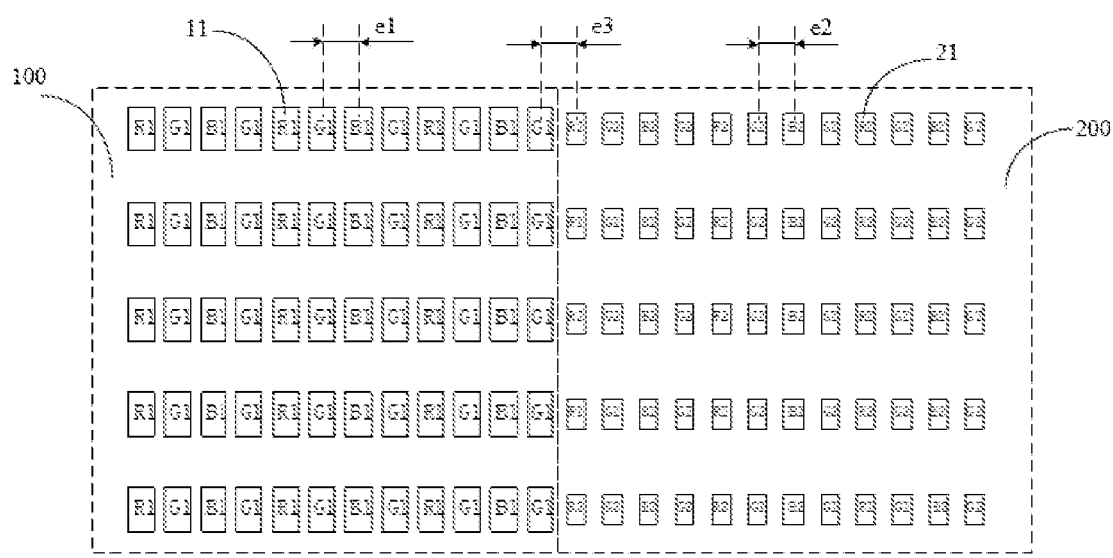
FIG. 5 is a schematic structural view of an arrangement of a third pixel unit provided by the embodiment of the present application.

Please refer to FIG. 5, in another case, the distance between the light-emitting layers of any two adjacent sub-pixels is equal, which is specifically expressed as: A distance $e_1$ between the light-emitting layers of any two adjacent first sub-pixels 11 is equal, a distance $e_2$ between the light-emitting layers of any two adjacent second sub-pixels 21 is equal, and a distance $e_3$ between the light-emitting layer of the first sub-pixel 11 and the light-emitting layer of the second sub-pixel 21 adjacent with each other is equal.

Since the anode is opaque, in the embodiment, in order to meet the requirement of the light transmittance of the display light transmission region 200, a ratio of a sum of areas of the second anode 402 corresponding to all the second sub-pixels 21 to an area of the display light transmission region 200 is less than or equal to 25%.

Figure 6:
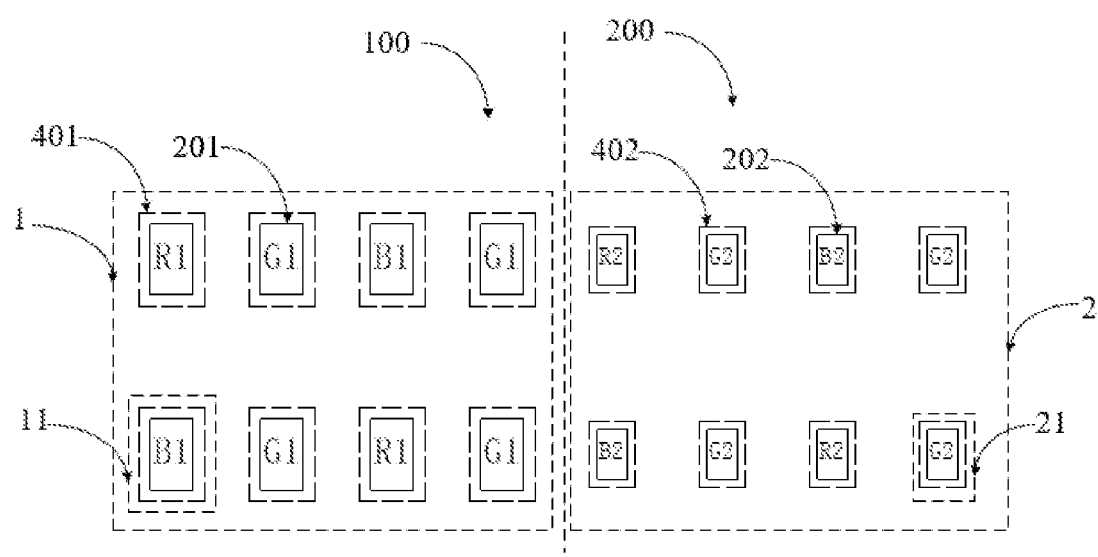
FIG. 6 is a partial schematic view of an arrangement structure of a pixel unit in FIG. 5.

Please refer to FIG. 6, service life of the light-emitting layer is related to a current density passing through the light-emitting layer. The higher the current density, the easier the light-emitting layer will age, and the faster the brightness of the light-emitting layer will decay. Conversely, the smaller the current density, the less likely the light-emitting layer is to age, and the slower the brightness decay of the light-emitting layer. When a ratio of an area of the light-emitting pixel of the second sub-pixel 21 to an area of the light-emitting pixel of the first sub-pixel 11 having the same color is too small, there is a difference in current density between the display light transmission region 200 and the main display region 100, resulting in a large difference in the lifetime decay rate of the second light-emitting layer 302 and the first light-emitting layer 301, which causes a difference in brightness, and the display effect is not ideal.

Therefore, in the embodiment, the ratio of the area of the light-emitting pixel of the second sub-pixel 21 to the area of the light-emitting pixel of the first sub-pixel 11 having the same color ranges from 0.2 to 0.6. That is, a ratio R21/R11 of an area of the light-emitting pixel of the second red sub-pixel R2 to an area of the light-emitting pixel of the first red sub-pixel R1 ranges from 0.2 to 0.6, a ratio G21/G11 of an area of the light-emitting pixel of the second green sub-pixel G2 to an area of the light-emitting pixel of the first green sub-pixel G1 ranges from 0.2 to 0.6, and a ratio B21/B11 of an area of the light-emitting pixel of the second blue sub-pixel B2 to an area of the light-emitting pixel of the first blue sub-pixel B1 ranges from 0.2 to 0.6. Since the area of the light-emitting pixel is the effective area of the light-emitting layer, which depends on a size of the pixel opening, thus, the ratio of the area of the light-emitting pixel of the second sub-pixel 21 to the area of the light-emitting pixel of the first sub-pixel 11 means that a ratio of an area of the second pixel opening 202 of the second sub-pixel 21 to an area of the first pixel opening 201 of the first sub-pixel 11.

R11 represents an area of the light-emitting pixel of the first red sub-pixel R1, R21 represents an area of the light-emitting pixel of the second red sub-pixel R2, G11 represents an area of the light-emitting pixel of the first green sub-pixel G1, G21 represents an area of the light-emitting pixel of the second green sub-pixel G2, B11 represents an area of the light-emitting pixel of the first blue sub-pixel B1, and B21 represents an area of the light-emitting pixel of the second blue sub-pixel B2.

Similarly, in a unit area, if a ratio of an area of the second anode 402 of the second sub-pixel 21 to an area of the first anode 401 of the first sub-pixel 11 having the same color is too large, it will affect the light transmittance of the display light transmission region 200, resulting in a decrease in a photo quality of the under-screen camera.

Therefore, in the embodiment, the ratio of the area of the second anode 402 corresponding to the second sub-pixel 21 to the area of the first anode 401 corresponding to the first sub-pixel 11 having the same color ranges from 0.2 to 0.6. That is, a ratio R22/R12 of an area of the second anode 402 corresponding to the second red sub-pixel R2 to an area of the first anode 401 corresponding to the first red sub-pixel R1 ranges from 0.2 to 0.6, a ratio G22/G12 of an area of the second green sub-pixel G2 corresponding to the second anode 402 to an area of the first anode 401 corresponding to the first green sub-pixel G1 ranges from 0.2 to 0.6, and a ratio B22/B12 of an area of the second anode 402 corresponding to the second blue sub-pixel B2 to an area of the first blue sub-pixel B1 corresponding to the first anode 401 ranges from 0.2 to 0.6.

Further, in a unit area, a ratio of the area of the light-emitting pixel of each second sub-pixel 21 to the area of the second anode 402 is greater than 0.3. That is, a ratio R21/R22 of the area of the light-emitting pixel of the second red sub-pixel R2 to the area of the second anode 402 is greater than 0.3, a ratio G21/G22 of the area of the light-emitting pixel of the second green sub-pixel G2 to the area of the second anode 402 is greater than 0.3, and a ratio B21/B22 of the area of the light-emitting pixel of the second blue sub-pixel B2 to the area of the second anode 402 is greater than 0.3.

R12 represents an area of the first anode 401 of the first red sub-pixel R1, R22 represents an area of the second anode 402 of the second red sub-pixel R2, G12 represents an area of the first anode 401 of the first green sub-pixel Cl, G22 represents an area of the second anode 402 of the second green sub-pixel G2, B12 represents an area of the first anode 401 of the first blue sub-pixel B1, and B22 represents an area of the second anode 402 of the second blue sub-pixel B2.

A shape of the first sub-pixel 11 may remain the same as a shape of the second sub-pixel 21. The shape of the first sub-pixel 11 can also be kept different from the shape of the second sub-pixel 21. The embodiment is not limited thereto. Specifically, the shape of the orthographic projection of the second sub-pixel 21 projected on the substrate 10 comprises a rectangle and an arc. Preferably, the shape of the orthographic projection of the second sub-pixel 21 projected on the substrate 10 is an ellipse or a circle.

Figure 7:
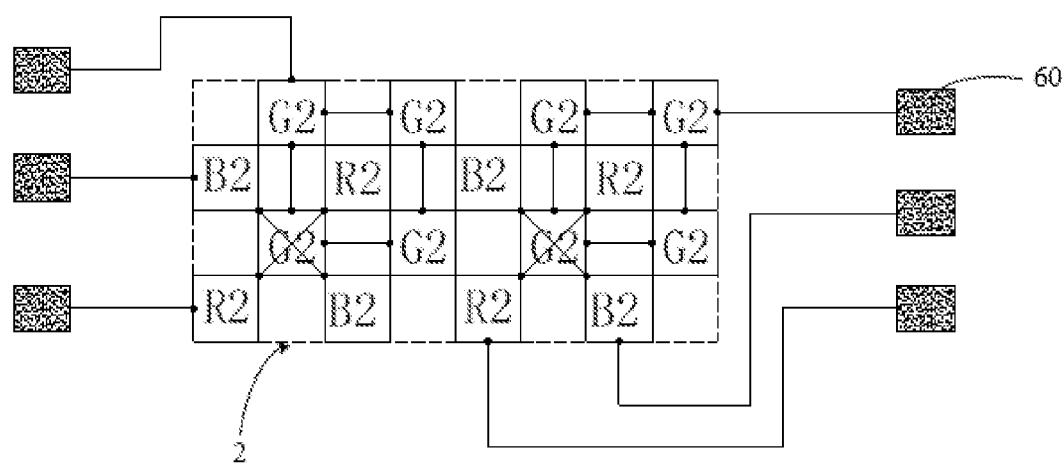
FIG. 7 is a schematic view of a connection relationship between a pixel driving circuit unit and a pixel unit according to the embodiment of the present application.

Further, please refer to FIG. 7, a plurality of pixel driving circuit units 60 for driving the second sub-pixels 21 to emit light are provided on the substrate 10, and the pixel driving circuit unit 60 is disposed outside the display light transmission region 200. Specifically, the pixel driving circuit unit 60 may be disposed in the main display region 100. Alternatively, a display transition region (not shown in the figure) may be further provided between the main display region 100 and the display light transmission region 200, and the pixel driving circuit unit 60 may be provided in the display transition region. The embodiment is not limited thereto.

The plurality of second sub-pixels 21 having the same color in the same second pixel unit 2 are electrically connected to the same pixel drive circuit unit 60, which can reduce the number of the pixel drive circuit units 60, thereby reducing areas of traces of the display light transmission region 200. The light transmittance of the display light transmission region 200 can be further improved, thereby further improving a shooting effect of the under-screen camera, and the display effect of the display light transmission region 200 is not excessively reduced at the same time. For example, all the second red sub-pixels R2 in the second pixel unit 2 are electrically connected to the same pixel driving circuit unit 60, all the second green sub-pixels G2 in the second pixel unit 2 are electrically connected to the same pixel driving circuit unit 60, and all the second blue sub-pixels B2 in the second pixel unit 2 are electrically connected to the same pixel driving circuit unit 60. Specifically, the traces may be signal traces for connecting all the pixel driving circuit units 60, and the signal traces may be scan lines and data lines.

The second anodes 402 of the plurality of second sub-pixels 21 having the same color in the same second pixel unit 2 are electrically connected to each other, and are all electrically connected to the corresponding pixel driving circuit unit 60. The second anode 402 can form a connected structure through a same process. For example, a transparent trace may be provided to connect the second anodes 402 of the second sub-pixels 21 having the same color to each other, and the transparent trace may be connected to the same pixel driving circuit unit 60. Of course, other ways can also be adopted. For example, in a case where the second anodes 402 of the plurality of the second sub-pixels 21 having the same color are not connected, a through hole may be provided at a position corresponding to the second anode 402 of each second sub-pixel 21, and then a drain of a driving transistor in the pixel driving circuit unit 60 is extended to each through hole, thereby achieving electrical connection with the second anode 402 in each through hole.

An embodiment of the present application further provides a display device comprising the above-mentioned display panel and a photosensitive element. The photosensitive element is disposed on a side of the display panel and is arranged corresponding to the display light transmission region 200. Specifically, the photosensitive element may be a camera, and the display device may be any product or component with a display function, such as a mobile phone, a tablet, a television, a monitor, a notebook, a digital photo frame, a navigator, etc.

Beneficial effects: in the display panel and the display device provided in the embodiment of the present application, the size of the first pixel opening in the main display region is designed to be larger than the size of the second pixel opening in the display light transmission region to meet lighting requirements of the under-screen camera disposed corresponding to the display light transmission region. The ratio of the orthographic projection area of the first light-emitting layer projected on the substrate to the orthographic projection area of the second light-emitting layer projected on the substrate ranges from 95% to 105%, so that in the process of manufacturing the display panel, the mask design used in the display light transmission region can be consistent with the mask design used in the main display region. There is no need to modify the mask sheet mesh, and there is no need to design the special mask for the display light transmission region, which is beneficial to save the processes, reduce the process costs, and improve the production efficiency. In addition, since only the size of the second pixel opening of the display light transmission region is reduced without reducing the PPI of the display light transmission region, it is beneficial to improve the display effect of the display light transmission region.

In summary, although the present application has been disclosed by preferred embodiments as described above, the above preferred embodiments are not intended to limit the present application. A person of ordinary skill in the art may make various changes and embellishments without departing from the spirit and scope of this application, so the scope of protection of this application is subject to the scope defined by the claims.

What is claimed is:

1. A display panel, comprising:
   a main display region and a display light transmission region; and
   a substrate and a pixel definition layer disposed on a side of the substrate;
   wherein the pixel definition layer defines a plurality of first pixel openings in the main display region and a first light-emitting layer is provided on each first pixel opening, and the pixel definition layer defines a plurality of second pixel openings in the display light transmission region and a second light-emitting layer is provided on each second pixel opening;
   wherein the first light-emitting layer is all disposed in the first pixel opening, an edge of the second light-emitting layer overflows the second pixel opening, and the second light-emitting layer covers the second pixel opening and the pixel definition layer disposed in the display light transmission region;
   wherein a size of the first pixel opening is greater than a size of the second pixel opening, and a ratio of an orthographic projection area of the first light-emitting layer projected on the substrate to an orthographic projection area of the second light-emitting layer projected on the substrate ranges from 95% to 105%;
   wherein a first anode and a second anode are disposed on the substrate;
   wherein the main display region comprises a plurality of first pixel units, and the display light transmission region comprises a plurality of second pixel units, each of the plurality of first pixel units comprises a plurality of first sub-pixels, and each of the plurality of second pixel units comprises a plurality of second sub-pixels;
   wherein a ratio of a light-emitting pixel area of each of the plurality of second sub-pixels to a light-emitting pixel area of each of the plurality of first sub-pixels having a same color ranging from 0.2 to 0.6; and
   wherein a ratio of an area of the second anode corresponding to each of the plurality of second sub-pixels to an area of the first anode corresponding to each of the plurality of first sub-pixels having a same color ranging from 0.2 to 0.6.

2. The display panel as claimed in claim 1, wherein the orthographic projection area of the first light-emitting layer projected on the substrate is equal to the orthographic projection area of the second light-emitting layer projected on the substrate.

3. The display panel as claimed in claim 2, wherein an orthographic projection shape of the first light-emitting layer projected on the substrate is the same as an orthographic projection shape of the second light-emitting layer projected on the substrate.

4. The display panel as claimed in claim 1, wherein the first anode is located at a bottom of each first pixel opening, and the second anode is located at a bottom of each second pixel opening; and
   a distance between an edge of the first anode away from the first pixel opening and a bottom edge of the first pixel opening is a first distance, and a distance between an edge of the second anode away from the second pixel opening and a bottom edge of the second pixel opening is a second distance;
   wherein the first distance is greater than the second distance.

5. The display panel as claimed in claim 4, wherein the second distance ranges from 1 μm to 3 μm.

6. The display panel as claimed in claim 4, wherein within a same unit area, a number of the first pixel units included in the main display region is equal to a number of the second pixel units included in the display light transmission region.

7. The display panel as claimed in claim 6, wherein a distance between two center points of two adjacent first pixel units is equal to a distance between two center points of two adjacent second pixel units, and a distance between the center point of the adjacent first pixel unit and the center point of the second pixel unit is equal to the distance between the two center points of two adjacent first pixel units.

* * * * *